United States Patent [19]
Raabe

[11] Patent Number: 4,475,117
[45] Date of Patent: Oct. 2, 1984

[54] LINEAR PN JUNCTION CAPACITANCE DIODE

[75] Inventor: Gerhard Raabe, Hamburg, Fed. Rep. of Germany

[73] Assignee: U.S. Philips Corporation, New York, N.Y.

[21] Appl. No.: 234,089

[22] Filed: Feb. 13, 1981

Related U.S. Application Data

[63] Continuation of Ser. No. 59,829, Jul. 23, 1979, abandoned.

[30] Foreign Application Priority Data

Jul. 29, 1978 [DE] Fed. Rep. of Germany ....... 2833319

[51] Int. Cl.$^3$ ............................................. H01L 29/92
[52] U.S. Cl. ...................................... 357/14; 357/51; 357/90
[58] Field of Search ............................. 357/14, 51, 90

[56] References Cited

FOREIGN PATENT DOCUMENTS 797439 10/1968 Canada ................................. 357/14

Primary Examiner—Joseph E. Clawson, Jr.
Attorney, Agent, or Firm—Robert T. Mayer; Steven R. Biren

[57] ABSTRACT

A capacitance diode has a substrate of a first conductivity type, an epitaxial layer of the first conductivity type present thereon, a first zone of the first conductivity type diffused therein and a second surface zone of the second opposite conductivity type over said first zone and forming a p-n junction with the first zone. According to the invention, the doping profile in the first zone varies substantially according to the equation $N(x) = N_o \cdot e^{-\beta x} + N_E$, where $N_o$ is the doping concentration of the first zone at the p-n junction, $N$ is the doping concentration of the epitaxial layer, and $x$ is the distance from the p-n junction, and where $N_o < 24 N_E$. As a result, a small frequency deviation is obtained, and this frequency deviation does not change sign.

4 Claims, 5 Drawing Figures

LINEAR PN JUNCTION CAPACITANCE DIODE

This is a continuation of application Ser. No. 059,829, filed July 23, 1979, now abandoned.

BACKGROUND OF THE INVENTION

The invention relates to a capacitance diode having an epitaxial layer of a first conductivity type provided on a substrate, a first zone of the first conductivity type formed therein by diffusion, and a surface-adjoining second zone of the second conductivity type forming a p-n junction with the first zone.

When such capacitance diodes are used, as is usual, as a tuning capacitance in parallel oscillatory circuits, the resonance curve of the oscillatory circuit is distorted due to the nonlinear characteristic of the diode.

This effect is described in "Valvo Berichte", Vol. XVII, No. 2, pp. 97-107 (in particular pp. 99-101). From this article it appears that when the capacitance diode is driven, a deviation of the resonant frequency f of $\Delta f/f$ occurs in the oscillatory circuit with the voltage $\Delta U$.

In a prior art capacitance diodes this frequency deviation assumes comparatively large and both positive and negative values, which is very undesirable.

SUMMARY OF THE INVENTION

It is the object of the invention to construct a capacitance diode of the kind described above in such manner that the frequency deviation in the driving range of the diode becomes as small as possible and does not change sign. According to the invention, a capacitance diode of the kind described is characterized in that the doping profile in the first zone varies substantially according to the relation $N(x) = N_o e^{-\beta x} + N_E$, where $N_E$ is the starting doping concentration of the epitaxial layer in at. $cm^{-3}$, $N_o$ is the doping concentration at the p-n junction in at.$cm^{-3}$ obtained by diffusion of the first zone, x is the distance from the p-n junction in cm. and $\beta$ is the slope of the diffusion profile in $cm.^{-1}$, where $N_o \leq 24 N_E$.

As a result of this doping profile, in the driving range of the diode the frequency deviation assumes only one sign and is small.

It is to be noted that the doping profile is deemed to satisfy the given equation when the limiting conditions:

$$0.90 N_o e^{-\beta x} + 0.95 N_E \leq N(x) \leq 1.10 N_o \cdot e^{-\beta x} + 1.05 N_E$$

are satisfied.

According to a preferred embodiment of the invention, $N_o$ is chosen to be $\leq 12 N_E$. This has for its advantage that the frequency deviation in the driving range of the diode then decreases monotonously.

According to another embodiment of the invention, a further reduction of the frequency deviation can be achieved when $\beta \leq 4.10^{-4} cm^{-1}$ is chosen. The frequency deviation then does not exceed 1%.

BRIEF DESCRIPTION OF THE DRAWING

The invention will now be described in greater detail, by way of example, with reference to the accompanying drawings, in which.

DETAILED DESCRIPTION

Figure 1:
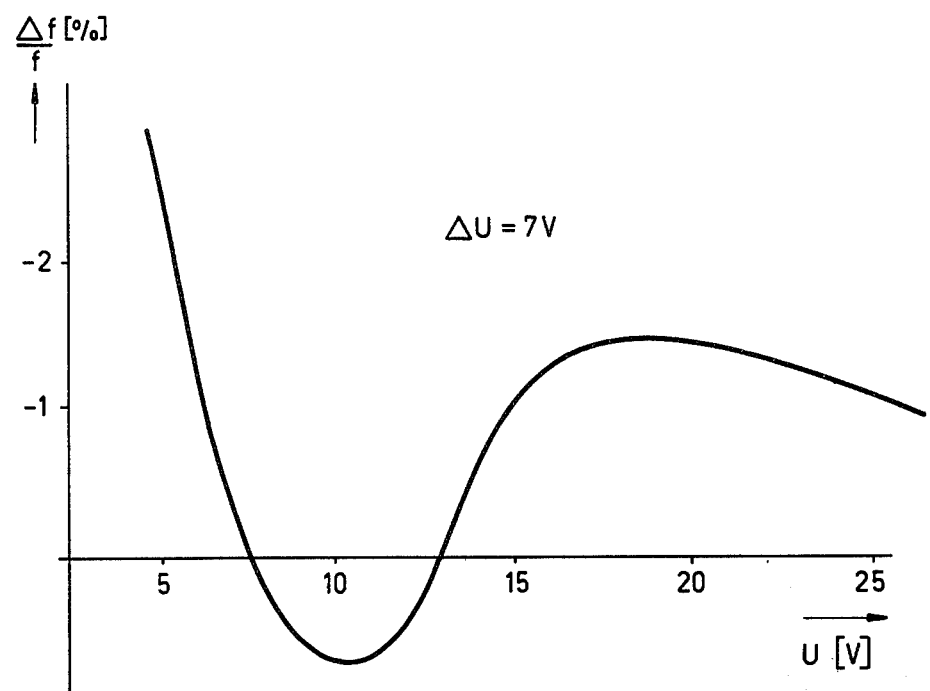
FIG. 1 shows the variation of the frequency deviation as a function of the applied voltage in a prior art capacitance diode.

FIG. 1 shows the variation of the frequency deviation $\Delta f/f$ in a prior art capacitance diode. As appears from the variation of this curve, the frequency deviation not only assumes absolute values of much more than 1% but it also changes sign, which is a significant drawback in the practical application of such capacitance diodes.

Figure 2:
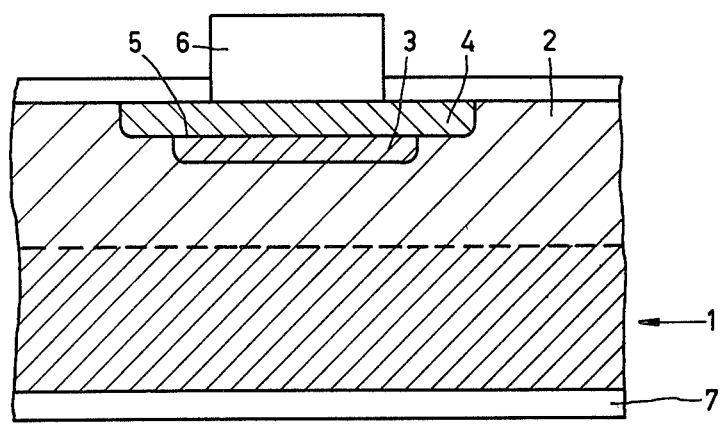
FIG. 2 is a cross-sectional view of a capacitance diode according to the invention.

FIG. 2 is a diagrammatic cross-sectional view, not drawn to scale, of a capacitance diode of the kind described. The semiconductor body 1 forming the diode consists of a substrate of a first conductivity type on which an epitaxial layer 2 of the same conductivity type but having a lower doping concentration is grown. A first zone 3, also of the first conductivity type, is diffused in the epitaxial layer 2 from its surface. Finally a second zone 4 of the second conductivity type is diffused in the semiconductor body, also from the surface of the epitaxial layer, and covers the first zone 3 but extends less deeply in the epitaxial layer 2 than the first zone so that, with the first zone 3, it forms the p-n junction 5 forming the actual capacitance diode. In a practical embodiment of the invention, the starting point is an n-type silicon substrate having a resistivity of $2.10^{-3}$ ohm.cm. The epitaxial layer 2 is grown on this substrate in a thickness of 5.2 $\mu m$ and a resistivity of 1.17 ohm.cm, that is to say a doping concentration of $N_E = 4.5.10^{15} cm^{-3}$. The zone 3 is then diffused in said epitaxial layer over an area of 192 $\mu m \times 192$ $\mu m$ in a surface concentration of approximately $5.10^{18} cm^{-3}$, sufficiently deep such that after the subsequent p+ diffusion a concentration of $N_O = 1.08.10^{17} cm^{-3}$ is obtained at the p-n junction.

The p-type zone 4 is then diffused over a surface area of 198 $\mu m \times 198$ $\mu m$, which comprises entirely the area of the zone 3 and projects beyond it on all sides, starting from a surface concentration of $4.10^{20}$ atoms per $cm.^{-3}$ down to a depth of 0.8 $\mu m$.

The capacitance diode thus manufactured is then contacted by metal layers 6 and 7 and mounted in an envelope.

Figure 3:
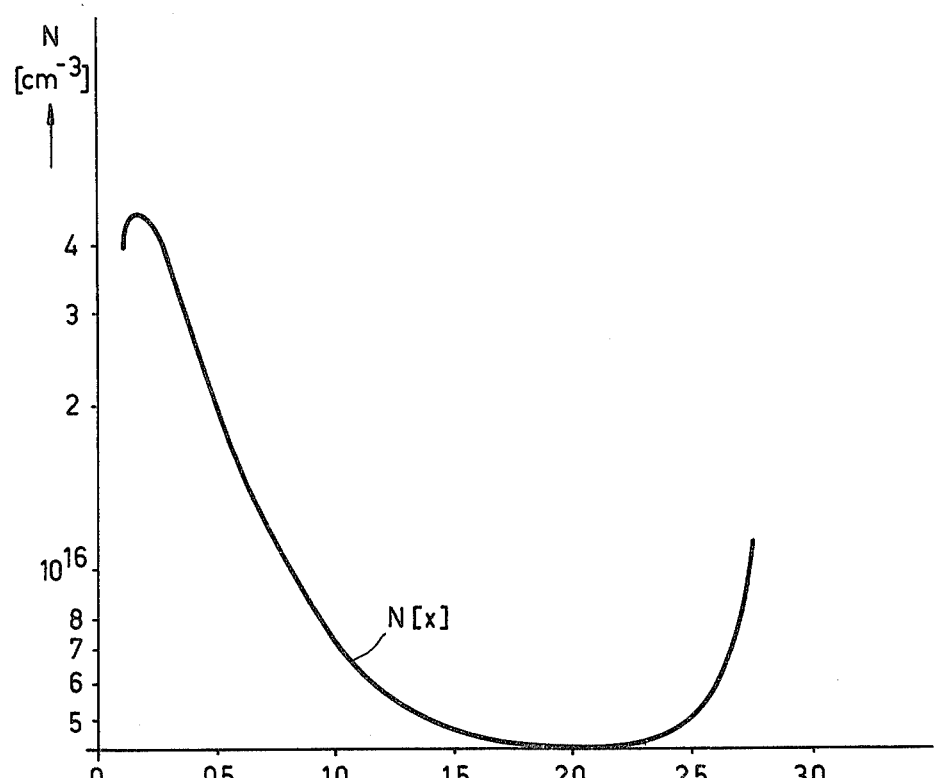
FIG. 3 shows the variation of the doping profile of the capacitance diode as shown in FIG. 2.

Taken from the p-n junction at $x = 0$, the resulting doping profile has the shape shown in FIG. 3 and, at least from approximately $x = 0.3$ $\mu m$ to approximately $x = 2$ $\mu m$, satisfies the equation $$N(x) = N_o e^{-\beta x} + N_E,$$

at least to such an approximation that $0.90 N_o e^{-\beta x} + 0.95 N_E \leq N(x) \leq 1.10 N_o e^{-\beta x} + 1.05 N_E$. In this range the value of $\beta$ is on the average $3.70.10^{-4} cm^{-1}$.

Figure 4:
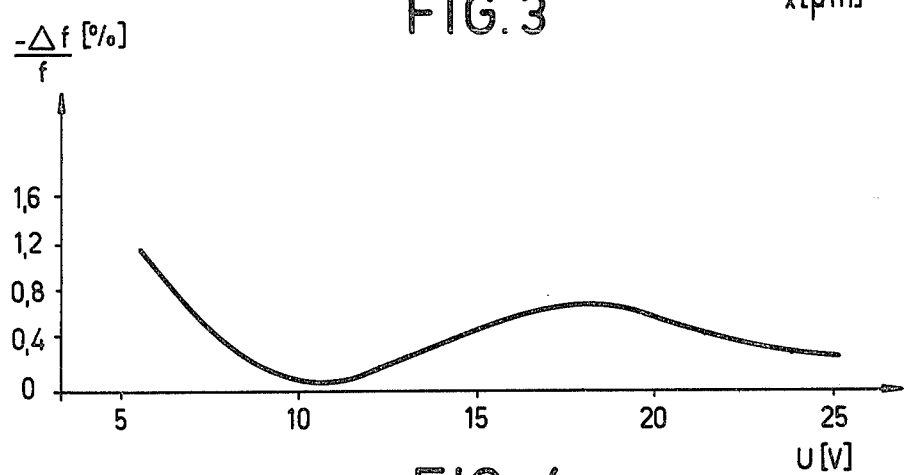
FIG. 4 shows the variation of the frequency deviation in a capacitance diode shown in FIGS. 2 and 3.

At this value of $\beta$ and with a ratio of $N_o$ to $N_E$ of approximately 24 derived from the above values, the variation of the frequency deviation shown in FIG. 4 is obtained from which it appears that with a diode thus proportioned the frequency deviation assumes only one sign (the deviation remains negative) and the value of the deviation does not exceed a value of 0.5% within the practical driving limits of the diode.

Similar ratios are obtained when the doping profile is proportioned so that the ratio of $N_o$ to $N_E$ is smaller than 24.

The increase of the value of the frequency deviation at higher voltages as appears from the curve of FIG. 4 could in principle be avoided but is to be ascribed to the increase of the doping at a larger distance from the p-n junction (see FIG. 3) which is necessary to give the capacitance diode a series resistance which is as slow as possible.

Figure 5:
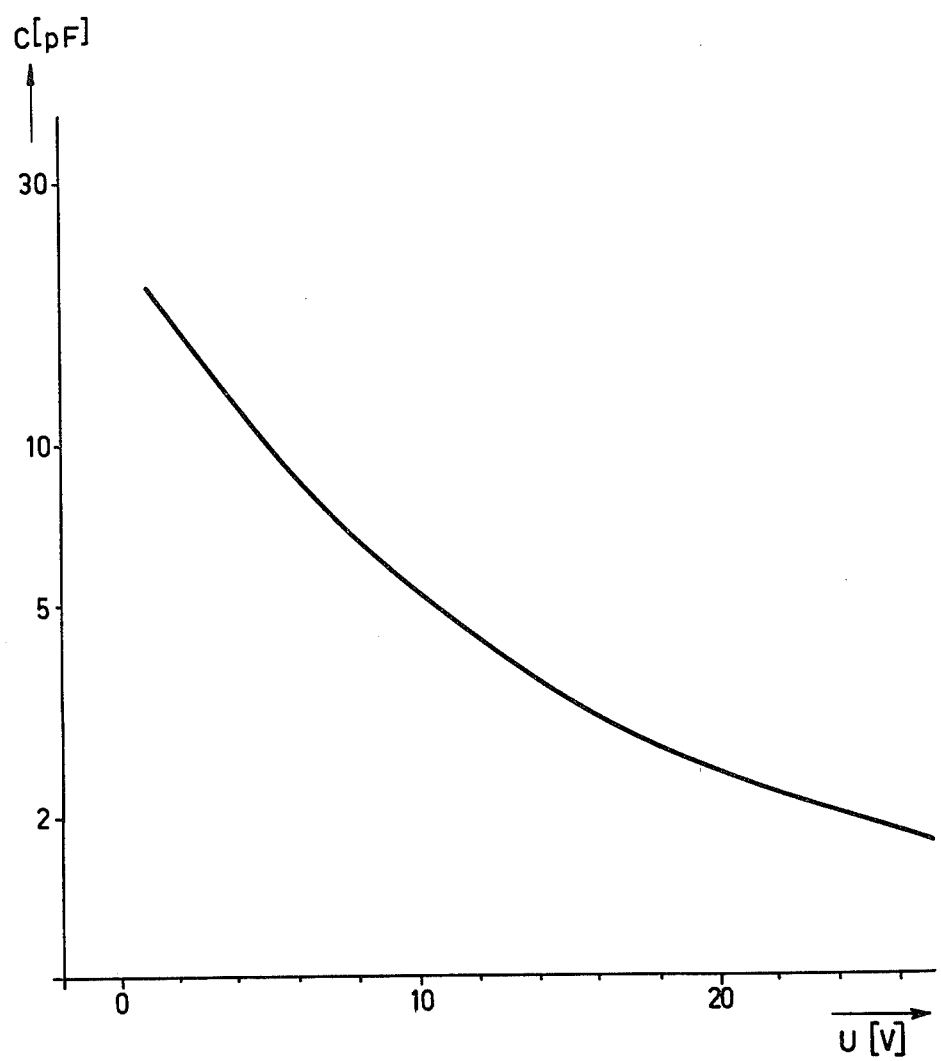
FIG. 5 shows the capacitance-voltage characteristic of the capacitance diode shown in in FIGS. 2 and 3.

FIG. 5 shows the measured capacitance-voltage characteristic of a capacitance diode as shown in FIGS. 2 and 3. The doping profile can be derived from such a characteristic since there exists an unambiguous relationship between the two curves. Starting from the basic equations (see, for example, "Solid State Electronics" 20 (1977), pp. 485.490, in particular p. 485).

$$N(x) = -\frac{C^3}{qEE_oA^2} \cdot \frac{dU}{dC} \text{ and} \tag{1}$$

$$C = \frac{EE_oA}{x} \tag{2}$$

wherein $N(x)$ is doping concentration at the distance x from the p-n junction $C$ = capacitance of the p-n junction, at the voltage U, $U$ = voltage at the p-n junction, $q$ = electron charge, $EE_o$ = dielectric constant of the semiconductor material, $A$ = surface area of the p-n junction.

From equations (1) and (2) it follows by integration that:

$$\int_{-U_D}^{U} \frac{EE_o}{q} dU = \int_{o}^{x} N(x) \cdot x \, dx \tag{3}$$

wherein $U_D$ is the diffusion voltage of the p-n junction. By elaborating for a given doping profile $N(x)$ the C-U characteristic can be constructed for this profile from (2) and (3). By starting from the above-given lowermost and uppermost tolerance limits for $N(x)$, two C-U characteristics can be obtained for given values of $N_o$ and $N_E$. If the measured C-U characteristic lies within said limit curves, the conditions of the invention are satisfied.

The invention may also be applied to capacitance diodes having a geometry different from that of the example. The conductivity types may also be reversed and semiconductor materials other than silicon, for example germanium or gallium arsenic, may be used.

What is claimed is:

1. A capacitance diode having a semiconductor body with a substrate, an epitaxial layer of a first conductivity type provided on said substrate, a first zone, also of the first conductivity type, formed in said epitaxial layer by diffusion, and a surface-adjoining second zone of the second conductivity type over said first zone and forming a p-n junction with the first zone, characterized in that the doping profile in the first zone varies substantially according to the relationship $N(x) = N_o e^{-\beta x} + N_E$, where $N_E$ is the starting doping concentration of the epitaxial layer in at.cm$^{-3}$, $N_o$ is the doping concentration of the p-n junction in at.cm.$^{-3}$ obtained by diffusion of the first zone, x is the distance from the p-n junction in cm. and $\beta$ is the slope of the diffusion profile in cm.$^{-1}$, and where $N_o < 24 N_E$.

2. A capacitance diode as claimed in claim 1, characterized in that $N_o \leq 12 N_E$.

3. A capacitance diode as claimed in claim 1 or 2, characterized in that $\beta \leq 4.10^{-4}$ cm$^{-1}$.

4. A capacitance diode as claimed in claim 1 or 2, characterized in that the frequency deviation of said diode as a function of voltage always maintains the same sign and does not exceed a value of 0.5 percent within the operating range of the diode.

* * * * *